United States Patent US 10,326,095 B2
Kang et al. Jun. 18, 2019

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: Min-Gu Kang, Bucheon-si (KR); DaeHwan Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/825,012

(22) Filed: Nov. 28, 2017

(65) Prior Publication Data

US 2018/0151827 A1 May 31, 2018

(30) Foreign Application Priority Data

Nov. 30, 2016 (KR) .................. 10-2016-0162349

(51) Int. Cl.
H01L 51/52 (2006.01)
H01L 51/50 (2006.01)
(Continued)

(52) U.S. Cl.
CPC ...... H01L 51/5096 (2013.01); H01L 27/3272 (2013.01); H01L 51/0554 (2013.01);
(Continued)

(58) Field of Classification Search
CPC ............. H01L 51/5296; H01L 51/5206; H01L 51/5209; H01L 51/5096; H01L 51/0554;
(Continued)

(56) References Cited

U.S. PATENT DOCUMENTS 7,557,382 B2 * 7/2009 Koh ..................... G09G 3/3225
257/184
7,576,485 B2 * 8/2009 Ohtani ................ H01L 27/3276
313/49
(Continued)

FOREIGN PATENT DOCUMENTS

CN 103337497 A 10/2013
CN 105576145 A 5/2016
(Continued)

OTHER PUBLICATIONS

Office Action dated Mar. 8, 2019 with English translation issued in the corresponding Chinese Patent Application No. 201711224065.4, pp. 1-16.

Primary Examiner — Ida M Soward
(74) Attorney, Agent, or Firm — Polsinelli PC

(57) ABSTRACT

An organic light emitting display panel includes a substrate, a driving transistor provided on the substrate, a first insulation layer covering the driving transistor, a second insulation layer covering the first insulation layer, a first electrode provided on the second insulation layer and connected to a first conductor part of the driving transistor, a second electrode provided on the second insulation layer and connected to a second conductor part of the driving transistor, a passivation layer covering the first electrode, the second electrode, and the second insulation layer, and an organic light emitting diode provided on the passivation layer, an anode configuring the organic light emitting diode is connected to the first conductor part, and the anode protrudes convexly from an upper surface of the passivation layer.

22 Claims, 4 Drawing Sheets

(51) Int. Cl.
*H01L 51/05* (2006.01)
*H01L 27/32* (2006.01)
*H01L 51/56* (2006.01)

(52) U.S. Cl.
CPC ...... *H01L 51/5209* (2013.01); *H01L 51/5237* (2013.01); *H01L 51/5284* (2013.01); *B32B 2457/206* (2013.01); *H01L 51/5206* (2013.01); *H01L 51/5296* (2013.01); *H01L 51/56* (2013.01)

(58) Field of Classification Search
CPC ............ H01L 51/5237; H01L 51/5284; B32B 2457/206
See application file for complete search history.

(56) References Cited

U.S. PATENT DOCUMENTS

| | | | | |
|---|---|---|---|---|
| 7,709,842 | B2* | 5/2010 | Jung | H01L 27/3244 257/59 |
| 7,863,811 | B2* | 1/2011 | Jun | H01L 27/3246 313/504 |
| 7,875,477 | B2* | 1/2011 | Chang | G02F 1/133555 257/E21.492 |
| 7,906,898 | B2* | 3/2011 | Lee | H01L 27/3244 313/504 |
| 7,911,568 | B2* | 3/2011 | Jung | H01L 27/124 257/59 |
| 8,039,841 | B2* | 10/2011 | Park | H01L 27/326 257/40 |
| 9,614,015 | B2* | 4/2017 | Park | H01L 27/3246 |
| 2003/0153182 | A1* | 8/2003 | Yamazaki | B23K 26/0604 438/689 |
| 2007/0108899 | A1* | 5/2007 | Jung | H01L 27/3276 313/506 |
| 2007/0159077 | A1* | 7/2007 | Kim | H01L 27/3265 313/504 |
| 2009/0286445 | A1* | 11/2009 | Yamazaki | H01L 27/3276 445/24 |
| 2012/0146887 | A1* | 6/2012 | Koyama | C09K 11/06 345/82 |
| 2015/0317028 | A1* | 11/2015 | Takahashi | G09G 3/3233 345/173 |
| 2016/0071916 | A1 | 3/2016 | Kim et al. | |
| 2016/0259190 | A1 | 9/2016 | Yan et al. | |
| 2016/0260792 | A1* | 9/2016 | Kim | H01L 51/5209 |
| 2016/0365392 | A1* | 12/2016 | Li | H01L 51/56 |
| 2017/0236892 | A1* | 8/2017 | Park | H01L 27/3279 257/40 |
| 2017/0317146 | A1* | 11/2017 | Lee | G06F 3/0412 |

FOREIGN PATENT DOCUMENTS

| | | |
|---|---|---|
| CN | 105895655 A | 8/2016 |
| KR | 20080054597 A * | 6/2008 |
| KR | 20140080235 A * | 6/2014 |

* cited by examiner

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application claims the benefit of the Korean Patent Application No. 10-2016-0162349 filed on Nov. 30, 2016, which is hereby incorporated by reference in its entirety.

BACKGROUND

Field of the Disclosure

The present disclosure relates to a display device, and more particularly, to an organic light emitting display panel and an organic light emitting display device including the same. Although the present disclosure has a wide scope of applications, it is particularly suitable for preventing a shift of a threshold voltage of a driving transistor that can be caused by scattered light in the organic light emitting display device.

Description of the Background

Flat panel display (FPD) devices have been applied to various kinds of electronic products such as portable phones, tablet personal computers (PCs), notebook PCs, etc. Examples of the FPD devices (hereinafter referred to as a display device) include liquid crystal display (LCD) devices, organic light emitting diode (OLED) display devices, etc. Recently, electrophoretic display devices (EPDs) are being widely used as a type of FPD device.

As a type of FPD device (hereinafter referred to as a display device), organic light emitting display devices have a fast response time of 1 ms or less and a low consumption power, and thus, are attracting much attention as next generation display devices.

FIG. 1 is a cross-sectional view of the related art organic light emitting display panel, and particularly, illustrating a cross-sectional view of an organic light emitting display panel having a top emission type where light is output through a cathode. In FIG. 1, a cross-sectional view of each of two adjacent pixels is illustrated.

In the related art organic light emitting display panel having the top emission type, as illustrated in FIG. 1, each of a plurality of pixels includes an organic light emitting diode OLED including an anode 11, a light emitting layer 12, and a cathode 13, and each of the pixels is defined by a bank 31.

The anode 11 is connected to a driving transistor Tdr, and brightness of the organic light emitting diode OLED is controlled by the driving transistor Tdr.

The driving transistor Tdr is covered by a passivation layer 21, and the organic light emitting diode OLED is provided on the passivation layer 21.

The driving transistor Tdr is covered by an insulation layer 20, and a plurality of metal lines 41 connected to the driving transistor Tdr or other various transistors are provided on the insulation layer 20.

In the related art organic light emitting display panel having the top emission type, light emitted from the light emitting layer 12 is output to the outside through the cathode 13. However, some of the light emitted from the light emitting layer 12 (hereinafter referred to as scattered light) may flow into the driving transistor Tdr through the passivation layer 21 or the bank 31.

For example, in FIG. 1, as in the arrow referred to as reference numeral L1, scattered light emitted from one pixel may directly flow into the driving transistor Tdr included in the one pixel, and as in an arrow referred to as reference numeral L2, the scattered light may be reflected by the metal lines 41 and may flow into the driving transistor Tdr included in the one pixel. Also, as in an arrow referred to as reference numeral L3, the scattered light may flow into a driving transistor Tdr of another pixel adjacent to the one pixel through the bank 31. In addition, light emitted from the light emitting layer 12 of one pixel may directly pass through the anode 11 and may flow into the driving transistor Tdr, or may be scattered by metal lines provided between the anode 11 and the driving transistor Tdr and may flow into the driving transistor Tdr or may flow into a driving transistor Tdr of another pixel through the bank 31.

As described above, the amount of scattered light which is emitted from the light emitting layer 12 and flows into the driving transistor Tdr is about 2% to 3% of light emitted from the light emitting layer 12.

In a case where the driving transistor Tdr includes an oxide semiconductor and has a coplanar type, the driving transistor Tdr is much vulnerable to the scattered light. Therefore, a threshold voltage of the driving transistor Tdr can be shifted.

In other words, in the related art organic light emitting display panel, since a structure for blocking the scattered light is not provided, as described above, the threshold voltage of the driving transistor Tdr can be shifted by the scattered light.

SUMMARY

Accordingly, the present disclosure is directed to provide an organic light emitting display panel and an organic light emitting display device including the same that substantially obviate one or more problems due to limitations and disadvantages of the related art.

An aspect of the present disclosure is directed to provide an organic light emitting display panel and an organic light emitting display device including the same, which include a blocking layer for blocking the inflow of scattered light, transferred from an organic light emitting diode, into a driving transistor.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display panel including a substrate, a driving transistor provided on the substrate, a first insulation layer covering the driving transistor, a second insulation layer covering the first insulation layer, a first electrode provided on the second insulation layer and connected to a first conductor part of the driving transistor, a second electrode provided on the second insulation layer and connected to a second conductor part of the driving transistor, a passivation layer covering the first electrode, the second electrode, and the second insulation layer, and an organic light emitting diode provided on the passivation layer, wherein an anode configuring the organic light emitting diode is connected to the first conductor part, and the anode protrudes convexly from an upper surface of the passivation layer.

In another aspect of the present disclosure, there is provided an organic light emitting display panel including a substrate, a driving transistor provided on the substrate, a first insulation layer covering the driving transistor, a first metal provided on the first insulation layer to cover the driving transistor, a second insulation layer covering the first insulation layer and the first metal, a first electrode provided on the second insulation layer and connected to a first conductor part of the driving transistor, a second electrode provided on the second insulation layer and connected to a second conductor part of the driving transistor, a passivation layer covering the first electrode, the second electrode, and the second insulation layer, and an organic light emitting diode provided on the passivation layer, wherein an anode configuring the organic light emitting diode is connected to the first conductor part.

In another aspect of the present disclosure, there is provided an organic light emitting display panel including a substrate, a driving transistor provided on the substrate, a first insulation layer covering the driving transistor, a second insulation layer covering the first insulation layer, a second metal provided on the second insulation layer to cover the driving transistor, a first electrode provided on the second insulation layer and connected to a first conductor part of the driving transistor, a second electrode provided on the second insulation layer and connected to a second conductor part of the driving transistor, a passivation layer covering the first electrode, the second electrode, the second insulation layer, and the second metal, and an organic light emitting diode provided on the passivation layer, wherein an anode configuring the organic light emitting diode is connected to the first conductor part.

In another aspect of the present disclosure, there is provided an organic light emitting display device including the organic light emitting display panel, a gate driver supplying a gate pulse to a plurality of gate lines included in the organic light emitting display panel, a data driver supplying data voltages to a plurality of data lines included in the organic light emitting display panel, and a controller controlling the gate driver and the data driver.

In a further aspect of the present disclosure, there is provided an organic light emitting display panel comprising a substrate; a driving transistor disposed on the substrate; a first insulation layer covering the driving transistor; a first metal provided on the first insulation layer to cover the driving transistor; a second insulation layer covering the first insulation layer and the first metal; a first electrode disposed on the second insulation layer and electrically connected to a first conductor part of the driving transistor; a second electrode disposed on the second insulation layer and electrically connected to a second conductor part of the driving transistor; a passivation layer covering the first electrode, the second electrode, and the second insulation layer; and an organic light emitting diode disposed on the passivation layer; and at least one of a first metal on the first insulation layer and a second metal on the second insulation layer, and the at least one of the first and second metals covering the driving transistor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
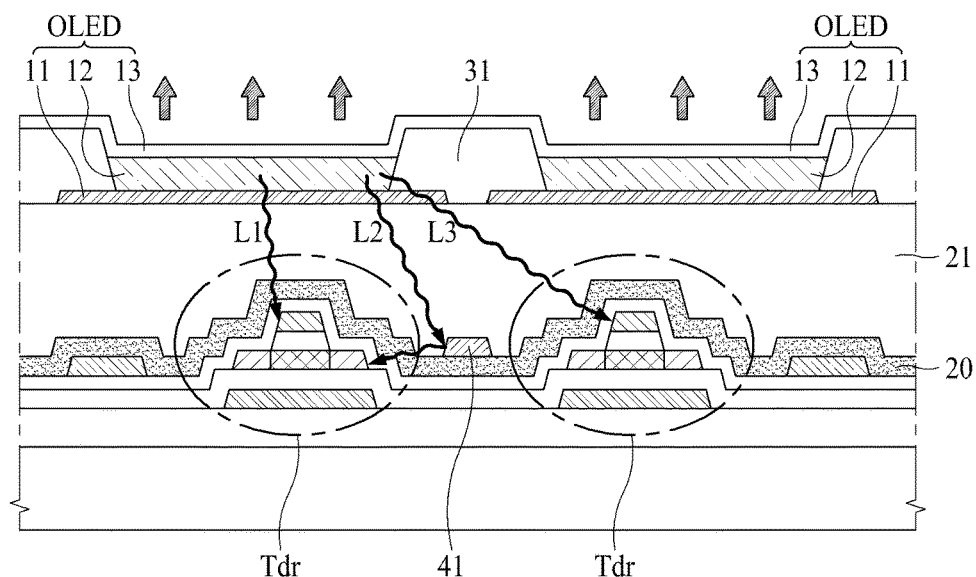
FIG. 1 illustrates a cross-sectional view of the related art organic light emitting display panel.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
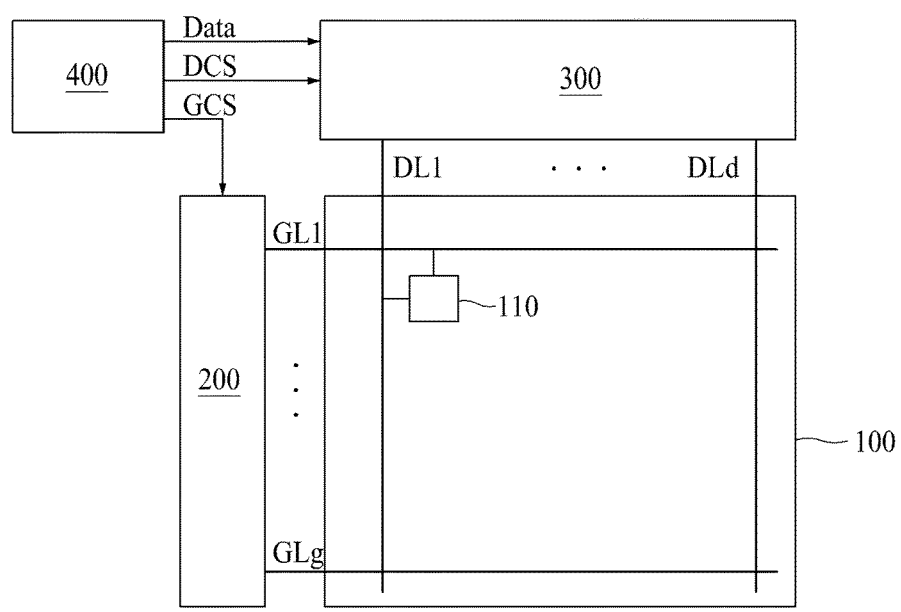
FIG. 2 is an exemplary diagram illustrating a configuration of an organic light emitting display device according to an aspect of the present disclosure.
Figure 3:
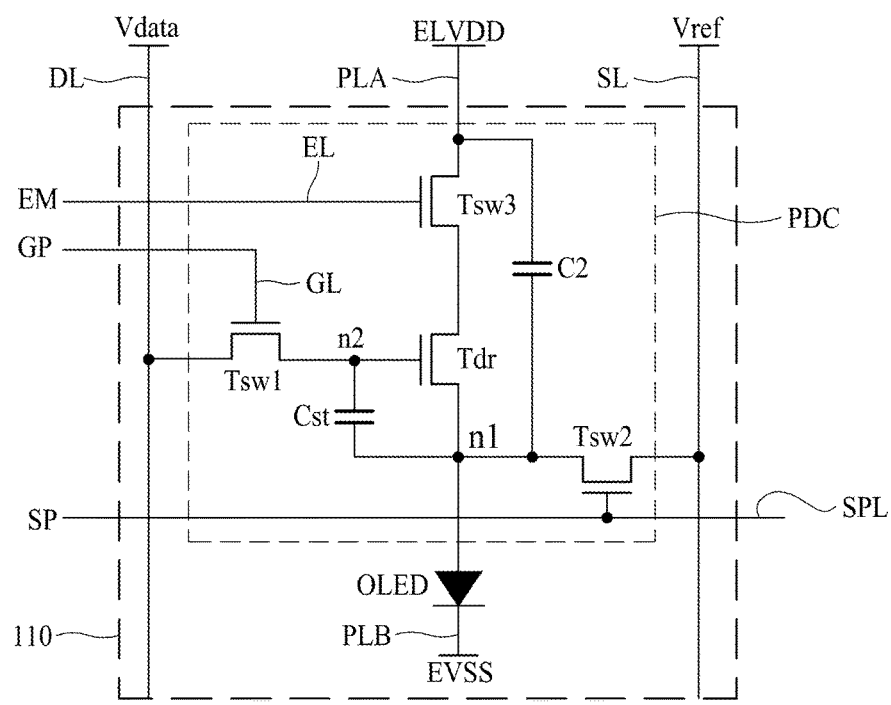
FIG. 3 is a circuit diagram of a pixel included in an organic light emitting display panel according to an aspect of the present disclosure.

FIG. 2 is an exemplary diagram illustrating a configuration of an organic light emitting display device according to an aspect of the present disclosure, and FIG. 3 is a circuit diagram of a pixel included in an organic light emitting display panel according to an aspect of the present disclosure.

The organic light emitting display device according to an aspect of the present disclosure, as illustrated in FIG. 2, may include an organic light emitting display panel 100 where a plurality of pixels 110 defined by a plurality of gate lines GL1 to GLg and a plurality of data lines DL1 to DLd are provided to display an image, a gate driver 200 which sequentially supplies a gate pulse to the gate lines GL1 to GLg included in the organic light emitting display panel 100, a data driver 300 which respectively supplies data voltages to the data lines DL1 to DLd included in the organic light emitting display panel 100, and a controller 400 which controls the gate driver 200 and the data driver 300.

First, the organic light emitting display panel 100 may include the gate lines GL1 to GLg through which the gate pulse is supplied, the data lines DL1 to DLd through which the data voltages are supplied, and the pixels 100 defined by the gate lines GL1 to GLg and the data lines DL1 to DLd. Each of the pixels 100 may include at least one coplanar oxide thin film transistor (hereinafter referred to as a transistor).

Each of the pixels 110 included in the organic light emitting display panel 100, as illustrated in FIG. 3, may include an organic light emitting diode OLED which emits light and a pixel driver PDC which drives the organic light emitting diode OLED. A plurality of signal lines DL, EL, GL, PLA, PLB, SL, and SPL for supplying a driving signal to the pixel driver PDC may be provided in each of the pixels 110.

A data voltage Vdata may be supplied through a data line DL, a gate pulse GP may be supplied through a gate line GL, a first driving power EVDD may be supplied through a power supply line PLA, a second driving power EVSS may be supplied through a driving power line PLB, a reference voltage Vref may be supplied through a sensing line SL, a sensing pulse SP for turning on/off a sensing transistor Tsw2 may be supplied through a sensing pulse line SPL, and an emission control line EM for driving an emission transistor Tsw3 may be supplied through an emission line EL.

For example, as illustrated in FIG. 3, the pixel driver PDC may include a switching transistor Tsw1 which is connected to the gate line GL and the data line DL, a driving transistor Tdr which controls a level of a current output from the organic light emitting diode OLED according to the data voltage Vdata transferred through the switching transistor Tsw1, the sensing transistor Tsw2 which senses a characteristic of the driving transistor Tdr, and the emission transistor Tsw3 which controls an emission timing of the driving transistor Tdr.

A storage capacitance Cst may be provided between a gate of the driving transistor Tdr and an anode of the organic light emitting diode OLED. The storage capacitance Cst may be referred to as a first capacitance.

A second capacitance C2 may be provided between the organic light emitting diode OLED and a terminal, supplied with the first driving power, of terminals of the emission transistor.

The switching transistor Tsw1 may be turned on by the gate pulse supplied through the gate line GL and may transfer the data voltage Vdata, supplied through the data line DL, to the gate of the driving transistor Tdr.

The sensing transistor Tsw2 may be connected to the sensing line SL and a first node n1 between the driving transistor Tdr and the organic light emitting diode OLED and may be turned on/off by the sensing pulse SP. In a sensing period, the sensing transistor Tsw2 may sense the characteristic of the driving transistor Tdr.

A second node n2 connected to the gate of the driving transistor Tdr may be connected to the switching transistor Tsw4. The storage capacitance Cst may be provided between the second node n2 and the first node n1.

The emission transistor Tsw3 may transfer the first driving power EVDD to the driving transistor Tdr or may cut off the first driving power EVDD, based on the emission control signal EM. When the emission transistor Tsw3 is turned on, a current may be supplied to the driving transistor Tdr, and thus, light may be emitted from the organic light emitting diode OLED.

In addition to a structure illustrated in FIG. 3, the pixel driver PDC may be configured in various structures.

Each of the transistors included in the pixel driver PDC may be a coplanar oxide thin film transistor (TFT) which is as described above. Particularly, in an aspect of the present disclosure, the driving transistor Tdr may be a coplanar oxide TFT.

The transistors may be provided in a non-display area outside a display area where the pixels are provided. For example, when the gate driver 200 is built into the non-display area of the organic light emitting display panel 100, each of transistors constituting the gate driver 200 may also be an oxide TFT.

Therefore, all transistors included in the organic light emitting display panel may be formed through the same process.

Subsequently, the controller 400 may output a gate control signal GCS for controlling the gate driver 200 and a data control signal DCS for controlling the data driver 300, based on a timing signal (for example, a vertical sync signal, a horizontal sync signal, a clock, etc.) supplied from an external system. The controller 400 may sample input video data received from the external system and may realign the sampled video data to supply digital image data Data, obtained through the realignment, to the data driver 300.

Subsequently, the data driver 300 may convert the image data Data input from the controller 400 into analog data voltages Vdata and may transfer the data voltages Vdata for one horizontal line to the data lines DL1 to DLd at every one horizontal period where the gate pulse GP is supplied to one gate line GL.

Finally, the gate driver 200 may sequentially supply the gate pulse to the gate lines GL1 to GLg of the organic light emitting display panel 100 in response to the gate control signal GCS input from the controller 400. Therefore, transistors included in each of pixels 110 supplied with the gate pulse may be turned on, and each of the pixels 110 may display an image. The gate driver 200 may be provided independently from the organic light emitting display panel 100 and may be electrically connected to the organic light emitting display panel 100 in various types, but is not limited thereto. In other aspects, the gate driver 200 may be provided as a gate-in panel (GIP) type which is built into the organic light emitting display panel 100.

Hereinabove, each of the data driver 300, the gate driver 200, and the controller 400 has been described as being independently provided. However, at least one of the data driver 300 and the gate driver 200 may be configured as one body with the controller 400.

Figure 4:
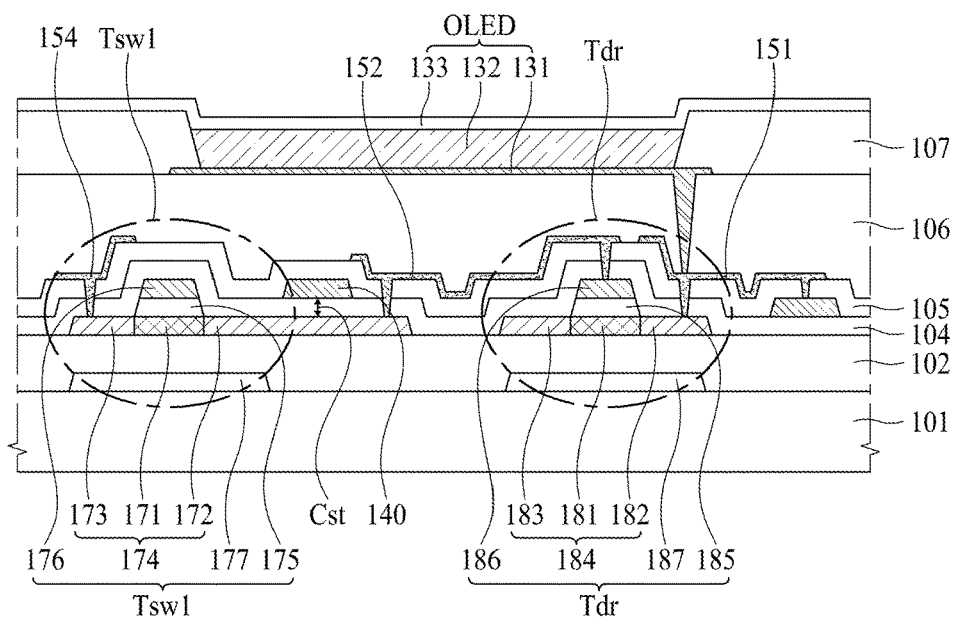
FIG. 4 is an exemplary diagram illustrating a cross-sectional surface of one pixel of an organic light emitting display panel according to an aspect of the present disclosure.

FIG. 4 is an exemplary diagram illustrating a cross-sectional view of a pixel of an organic light emitting display panel 100 according to an aspect of the present disclosure.

The organic light emitting display panel 100 according to an aspect of the present disclosure, as illustrated in FIG. 4, may include a substrate 101, a switching transistor Tsw1, a driving transistor Tdr, a first insulation layer 104, a capacitance electrode 140, a second insulation layer 105, a first electrode 151, a second electrode 152, a passivation layer 106, an organic light emitting diode OLED, and a bank 107.

The substrate 101 may be a glass substrate, a plastic substrate, or the like.

A buffer 102 may be provided on the substrate 101.

The driving transistor Tdr may be connected between the power supply line PLA and the organic light emitting diode OLED to control the amount of current flowing into the organic light emitting diode OLED.

The driving transistor Tdr may include a first channel 184 provided on the substrate 101 or the buffer 102, a first gate insulation layer 185 provided on the first channel 184, and a first gate 186 provided on the first gate insulation layer 185. The first channel 184 may include a first active part 181 including an oxide semiconductor, a first conductor part 182 having conductivity, and a second conductor part 183 having conductivity.

The first gate 186 may be connected to the switching transistor Tsw1.

The driving transistor Tdr may have a coplanar type. In the coplanar type, the first gate 186 may be provided over the first active part 181.

The driving transistor Tdr may further include a first lower metal 187 which is provided on the substrate 101 to cover the first channel 184. The first lower metal 187 may be covered by the buffer 102.

The switching transistor Tsw1 may be connected between a data line DL and the driving transistor Tdr.

The switching transistor Tsw1 may be turned on by a gate pulse supplied through the gate line GL and may supply a data voltage Vdata to the first gate 186 of the driving transistor Tdr through the data line DL.

The switching transistor Tsw1 may include a second channel 174 provided on the substrate 101 or the buffer 102, a second gate insulation layer 175 provided on the second channel 174, and a second gate 176 provided on the second gate insulation layer 175. The second channel 174 may include a second active part 171 including an oxide semiconductor, a third conductor part 172 having conductivity, and a fourth conductor part 173 having conductivity.

The third conductor part 172 may be connected to the first gate 186 of the driving transistor Tdr.

The switching transistor Tsw1 may be provided as a coplanar type. However, the switching transistor Tsw1 may include a top gate type where the second gate insulation layer is provided on the second gate and the second active part is provided on the second gate insulation layer.

The switching transistor Tsw1 may further include a second lower metal 177 which is provided on the substrate 101 to cover the second channel 174. The second lower metal 177 may be covered by the buffer 102.

The first insulation layer 104 may cover the switching transistor Tsw1 and the driving transistor Tdr. The first insulation layer may be formed of an organic material, an inorganic material, and/or the like.

A capacitance electrode 140 may be provided on the first insulation layer 104. The capacitance electrode 140 may constitute the storage capacitance Cst. In FIG. 4, two capacitance electrodes 140 referred to as reference numeral 140 are illustrated like being separated from each other in the drawing, but are substantially and electrically connected to each other.

That is, the capacitance electrode 140 may be provided on the first insulation layer 104, for configuring the storage capacitance Cst.

Moreover, in addition to the capacitance electrode 140, at least one of the signal lines DL, EL, GL, PLA, PLB, SL, and SPL may be provided on the first insulation layer 104.

The second insulation layer 105 may cover the first insulation layer 104 and the capacitance electrode 140. The second insulation layer 105 may be formed of an organic material, an inorganic material, and/or the like.

A first electrode 151 connected to the first conductor part 182 of the driving transistor Tdr and a second electrode 152 connected to the second conductor part 183 may be provided on the second insulation layer 105. The second electrode 152 may be connected to the third conductor part 172 of the switching transistor Tsw1.

A fourth electrode 154 connected to the fourth conductor part 173 of the switching transistor Tsw1 may be provided on the second insulation layer 105. The fourth electrode 154 may be connected to the data line DL.

Moreover, at least one of the signal lines DL, EL, GL, PLA, PLB, SL, and SPL may be provided on the second insulation layer 105.

The passivation layer 106 may cover the first electrode 151, the second electrode 152, the fourth electrode 154, and the second insulation layer 105. The passivation layer 106 may be formed of at least one layer including an organic material or an inorganic material. The passivation layer 106 may planarize upper ends of the first electrode 151, the second electrode 152, the fourth electrode 154, and the second insulation layer 105.

The organic light emitting diode OLED may be provided on the passivation layer 106. The organic light emitting diode OLED may include an anode 131, a light emitting layer 132, and a cathode 133. The anode 131 of the organic light emitting diode OLED may be connected to the first conductor part 182 of the driving transistor Tdr.

The organic light emitting diode OLED may be surrounded by the bank 107. Each of a plurality of pixels may be defined by the bank 107.

Hereinabove, a cross-sectional view of each pixel applied to the organic light emitting display panel according to an aspect of the present disclosure has been described with reference to FIG. 4. Hereinafter, other aspects of the present disclosure will be described in detail with reference to FIGS. 5 to 8.

Figure 5:
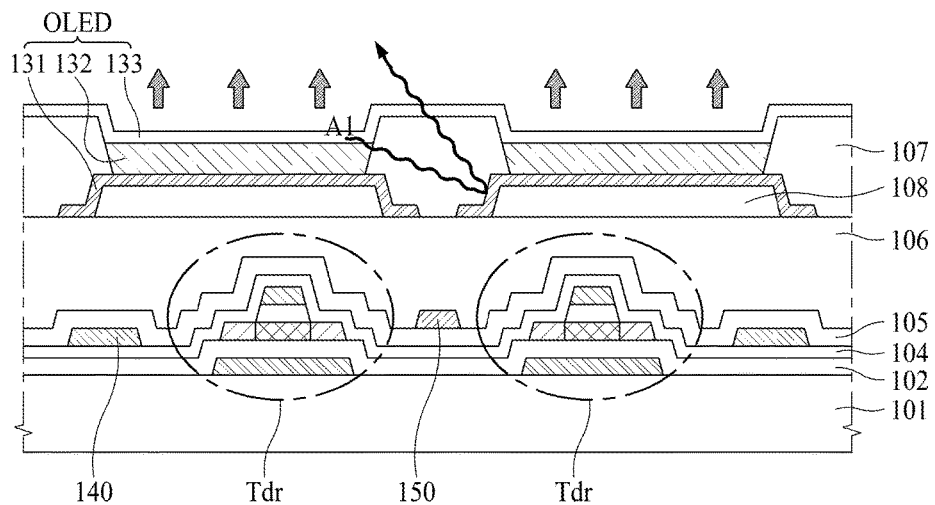
FIG. 5 is an exemplary diagram illustrating a cross-sectional view of each of two adjacent pixels of an organic light emitting display panel according to an aspect of the present disclosure.

FIG. 5 is an exemplary diagram illustrating a cross-sectional view of each of two adjacent pixels of an organic light emitting display panel according to an aspect of the present disclosure. In the following description, details which are the same as or similar to the details described above with reference to FIGS. 2 to 4 are omitted or will be briefly described.

A plurality of pixels included in the organic light emitting display panel according to an aspect of the present disclosure, as described above and illustrated in FIG. 5, may each include the substrate 101, the driving transistor Tdr provided on the substrate 101, the first insulation layer 104 covering the driving transistor Tdr, the second insulation layer 105 covering the first insulation layer 104, the first electrode 151 provided on the second insulation layer 105 and connected to the first conductor part 182 of the driving transistor Tdr, the second electrode 152 provided on the second insulation layer 105 and connected to the second conductor part 183 of the driving transistor Tdr, the passivation layer 106 covering the first and second electrodes 151 and 152 and the second insulation layer 105, and the organic light emitting diode OLED provided on the passivation layer 106.

Here, the anode 131 constituting the organic light emitting diode OLED may be connected to the first conductor part 182.

Particularly, in the organic light emitting display panel according to an aspect of the present disclosure, as illustrated in FIG. 5, the anode 131 may convexly protrude from an upper surface of the passivation layer 106.

For the above-described structure, as illustrated in FIG. 5, a protrusion 108 convexly protruding from the upper surface of the passivation layer 106 may be provided on the passivation layer 106.

The protrusion 108 may be formed of an organic layer having black color. For example, the protrusion 108 may be formed of a material which configures a black matrix applied to an LCD device.

The protrusion 108 may be formed as one body with the passivation layer 106 and may be patterned. For example, after the passivation layer 106 is formed, an area other than the protrusion 108 may be etched, thereby forming the protrusion 108.

However, the protrusion 108 may be formed separately from the passivation layer 106. For example, a material which forms the protrusion 108 may be coated on the passivation layer 106, and then, by etching a portion of the material, the protrusion 108 may be formed. In this case, the protrusion 108 may be formed thicker than the passivation layer 106, for performing a planarization function. For example, the passivation layer 106 may be thinly formed of an inorganic material, and the protrusion 108 may be thickly formed of an organic material and may perform the planarization function.

In this case, the anode 131 may cover a surface of the protrusion 108.

An outer portion of the anode 131 may be covered by the bank 107 which defines each of a plurality of pixels.

More specifically, the anode 131 may surround the protrusion 108 from a surface of the passivation layer 106. Therefore, the entire surface of the protrusion 108 may be covered by the anode 131.

A center portion, where the light emitting layer 132 is provided, of the anode 131 may be provided as a plane. To this end, a center portion of the protrusion 108 may also be provided as a plane.

An inclined side surface of the anode 131 and a lower surface of the anode 131 covering the passivation layer 106, as illustrated in FIG. 5, may be covered by the bank 107. According to the above-described structure, as illustrated in FIG. 5, first scattered light A emitted from the light emitting layer 132 included in one pixel may be reflected by the anode 131 covered by the bank 107 and may be output to the outside. Therefore, the first scattered light A cannot flow into a driving transistor Tdr of another pixel through the bank 107, and moreover, cannot flow into a driving transistor Tdr of the one pixel including the light emitting layer 132.

The driving transistor Tdr may be provided under the anode 131.

In this case, the driving transistor Tdr may be provided under the anode 131 so that the first gate 186, the first active part 181, the first conductor part 182, and the second conductor part 183 constituting the driving transistor Tdr are all covered by the anode 131. Particularly, the first active part 181 of the driving transistor Tdr is sensitive to light. Therefore, the anode 131 may be disposed to cover the first active part 181.

Moreover, the switching transistor Tsw1 may be disposed under the anode 131. However, even when the switching transistor Tsw1 is exposed to the scattered light emitted from the light emitting layer 132 and thus a characteristic of the switching transistor Tsw1 is changed, the change in characteristic of the switching transistor Tsw1 does not affect displaying of an image, and thus, the switching transistor Tsw1 may not be covered by the anode 131.

Figure 6:
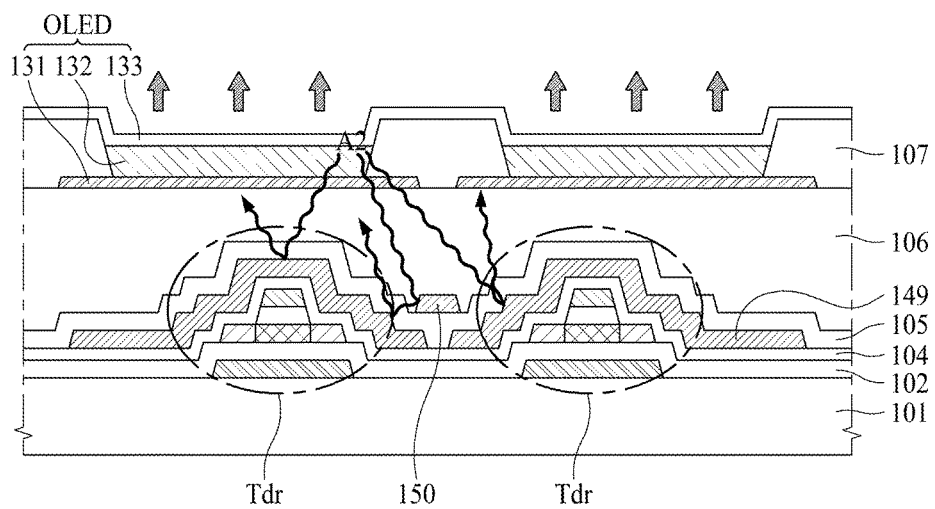
FIG. 6 is another exemplary diagram illustrating a cross-sectional view of each of two adjacent pixels of an organic light emitting display panel according to an aspect of the present disclosure.
Figure 7:
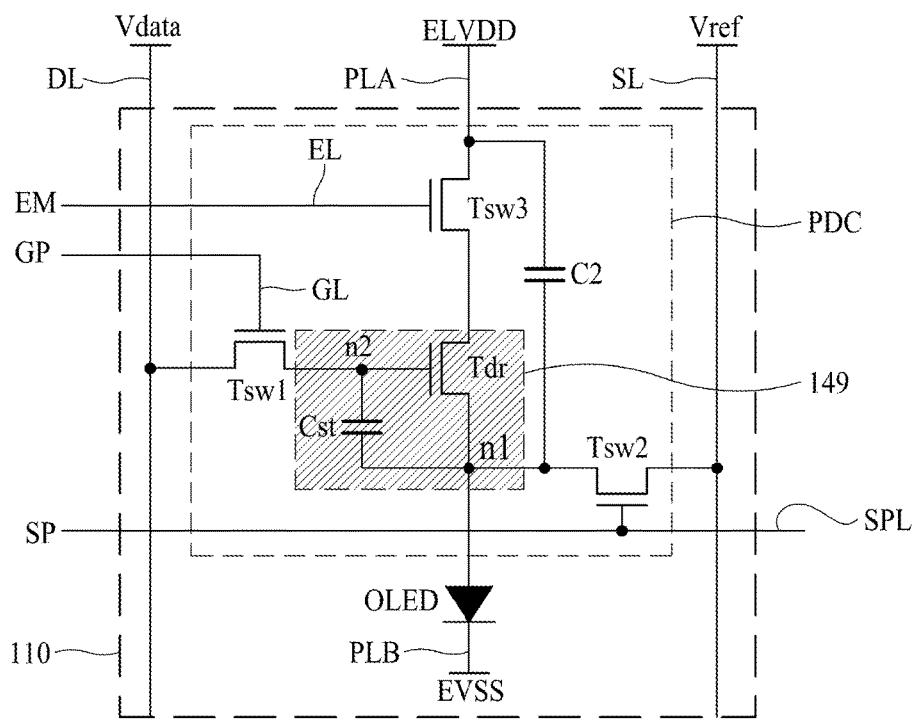
FIG. 7 is another circuit diagram of a pixel included in an organic light emitting display panel according to an aspect of the present disclosure.

FIG. 6 is another exemplary diagram illustrating a cross-sectional view of each of two adjacent pixels of an organic light emitting display panel according to an aspect of the present disclosure. FIG. 7 is another circuit diagram of a pixel included in an organic light emitting display panel according to an aspect of the present disclosure, and particularly, is a circuit diagram where a first metal 149 described below is provided. In the following description, details which are the same as or similar to the details described above with reference to FIGS. 2 to 5 are omitted or will be briefly described.

A plurality of pixels included in the organic light emitting display panel according to an aspect of the present disclosure, as described above and illustrated in FIG. 6, may each include the substrate 101, the driving transistor Tdr provided on the substrate 101, the first insulation layer 104 covering the driving transistor Tdr, a first metal 149 provided on the first insulation layer 104 to cover the driving transistor Tdr, the second insulation layer 105 covering the first insulation layer 104 and the first metal 149, the first electrode 151 provided on the second insulation layer 105 and connected to the first conductor part 182 of the driving transistor Tdr, the second electrode 152 provided on the second insulation layer 105 and connected to the second conductor part 183 of the driving transistor Tdr, the passivation layer 106 covering the first and second electrodes 151 and 152 and the second insulation layer 105, and the organic light emitting diode OLED provided on the passivation layer 106. Here, the anode 131 constituting the organic light emitting diode OLED may be connected to the first conductor part 182.

A metal line 150 constituting at least one of the signal lines DL, EL, GL, PLA, PLB, SL, and SPL may be provided on the second insulation layer 105. The metal line 150 may be formed of a material which is the same as that of the first electrode 151, the second electrode 152, and the fourth electrode 154, and may be formed through the same process as a process of forming the first electrode 151, the second electrode 152, and the fourth electrode 154.

More specifically, as illustrated in FIGS. 6 and 7, the first metal 149 may be provided on the first insulation layer 104 and may be covered by the second insulation layer 105. The first metal 149 may cover the driving transistor Tdr.

According to the above-described structure, as illustrated in FIG. 6, second scattered light A2 emitted from the light emitting layer 132 included in one pixel may be reflected by the first metal 149, and thus, cannot flow into the driving transistor Tdr.

In this case, the driving transistor Tdr may be provided under the first metal 149 so that the first gate 186, the first active part 181, the first conductor part 182, and the second conductor part 183 constituting the driving transistor Tdr are all covered by the first metal 149. Particularly, the first active part 181 of the driving transistor Tdr is sensitive to light. Therefore, the first metal 149 may be disposed to necessarily cover the first active part 181.

Moreover, the switching transistor Tsw1 may be disposed under the first metal 149. However, even when the switching transistor Tsw1 is exposed to the scattered light emitted from the light emitting layer 132 and thus a characteristic of the switching transistor Tsw1 is changed, the change in characteristic of the switching transistor Tsw1 does not affect displaying of an image, and thus, the switching transistor Tsw1 may not be covered by the first metal 149.

In a case where the switching transistor Tsw1 should be blocked by metal for blocking scattered light, the switching transistor Tsw1 may be covered by the first metal 149, or may be covered by another metal layer provided on the first insulation layer 104.

The first metal 149 may be included in the organic light emitting display panel described above with reference to FIG. 5.

Figure 8:
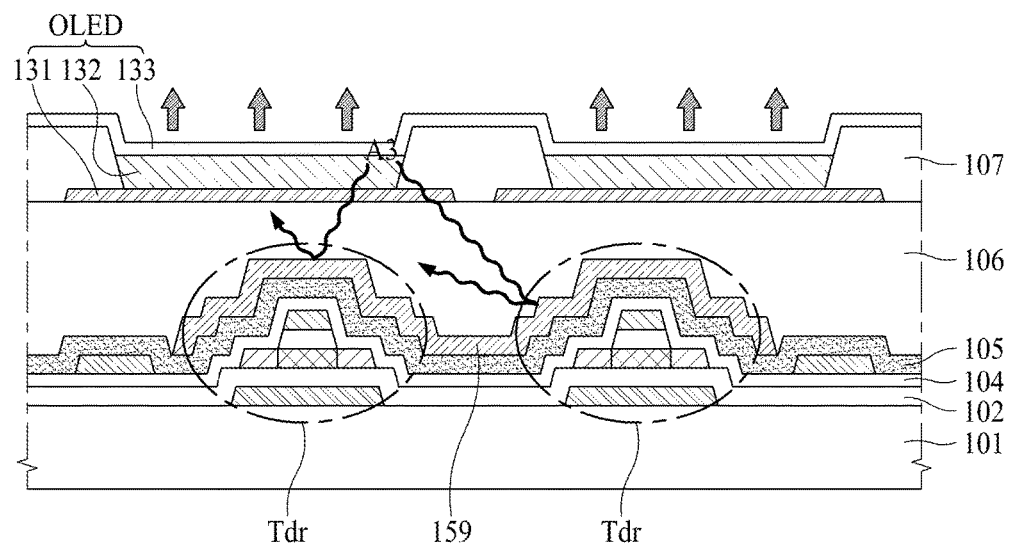
FIG. 8 is yet another exemplary diagram illustrating a cross-sectional view of each of two adjacent pixels of an organic light emitting display panel according to an aspect of the present disclosure.

FIG. 8 is yet another exemplary diagram illustrating a cross-sectional view of each of two adjacent pixels of an organic light emitting display panel according to an aspect of the present disclosure. In the following description, details which are the same as or similar to the details described above with reference to FIGS. 2 to 7 are omitted or will be briefly described.

A plurality of pixels included in the organic light emitting display panel according to an aspect of the present disclosure, as described above and illustrated in FIG. 8, may each include the substrate 101, the driving transistor Tdr provided on the substrate 101, the first insulation layer 104 covering the driving transistor Tdr, the second insulation layer 105 covering the first insulation layer 104, a second metal 159 provided on the second insulation layer 105 to cover the driving transistor Tdr, the first electrode 151 provided on the second insulation layer 105 and connected to the first conductor part 182 of the driving transistor Tdr, the second electrode 152 provided on the second insulation layer 105 and connected to the second conductor part 183 of the driving transistor Tdr, the passivation layer 106 covering the first and second electrodes 151 and 152, the second insulation layer 105, and the second metal 159, and the organic light emitting diode OLED provided on the passivation layer 106. Here, the anode 131 constituting the organic light emitting diode OLED may be connected to the first conductor part 182.

The metal line 150 constituting at least one of the signal lines DL, EL, GL, PLA, PLB, SL, and SPL may be provided on the second insulation layer 105.

The second metal 159 may be formed of a material which is the same as that of the metal line 150, the first electrode 151, the second electrode 152, and the fourth electrode 154, and may be formed through the same process as a process of forming the first electrode 151, the second electrode 152, and the fourth electrode 154.

As illustrated in FIG. 8, the second metal 159 may be provided on the second insulation layer 105 and may be covered by the second insulation layer 106. The second metal 159 may cover the driving transistor Tdr.

According to the above-described structure, as illustrated in FIG. 8, third scattered light A3 emitted from the light emitting layer 132 included in one pixel may be reflected by the second metal 159, and thus, cannot flow into the driving transistor Tdr.

In this case, the driving transistor Tdr may be provided under the second metal 159 so that the first gate 186, the first active part 181, the first conductor part 182, and the second conductor part 183 constituting the driving transistor Tdr are all covered by the second metal 159. Particularly, the first active part 181 of the driving transistor Tdr is sensitive to light. Therefore, the second metal 159 may be disposed to necessarily cover the first active part 181.

Moreover, the switching transistor Tsw1 may be disposed under the second metal 159. However, even when the switching transistor Tsw1 is exposed to the scattered light emitted from the light emitting layer 132 and thus a characteristic of the switching transistor Tsw1 is changed, the change in characteristic of the switching transistor Tsw1 does not affect displaying of an image, and thus, the switching transistor Tsw1 may not be covered by the second metal 159.

In a case where the switching transistor Tsw1 should be blocked by metal for blocking scattered light, the switching transistor Tsw1 may be covered by the second metal 159, or may be covered by another metal layer provided on the first insulation layer 104.

The second metal 159 may be included in the organic light emitting display panel described above with reference to FIG. 5 or the organic light emitting display panel described above with reference to FIGS. 6 and 7.

The above-described features of the present disclosure will be briefly summarized below.

In the present disclosure, the inflow of scattered light, emitted from the light emitting layer 132, into the driving transistor Tdr can be prevented by the above described structures.

To this end, in an aspect of the present disclosure, by using the protrusion 108 illustrated in FIG. 5, the anode 131 may have a shape which protrudes from the passivation layer 106.

Moreover, in an aspect of the present disclosure, as illustrated in FIG. 6, the first metal 149 which covers the driving transistor Tdr may be provided on the first insulation layer 104.

Moreover, in an aspect of the present disclosure, as illustrated in FIG. 8, the second metal 159 which covers the driving transistor Tdr may be provided on the second insulation layer 105.

As described above, according to an aspect of the present disclosure, scattered light transferred from an organic light emitting diode cannot flow into a driving transistor. Accordingly, a threshold voltage of the driving transistor is not shifted.

Therefore, according to an aspect of the present disclosure, the organic light emitting display device is stably driven.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display panel comprising:
    a substrate;
    a driving transistor disposed on the substrate;
    a first insulation layer covering the driving transistor;
    a second insulation layer covering the first insulation layer;
    a first electrode disposed on the second insulation layer and connected to a first conductor part of the driving transistor;
    a second electrode disposed on the second insulation layer and connected to a gate of the driving transistor;
    a passivation layer covering the first electrode, the second electrode, and the second insulation layer; and
    an organic light emitting diode disposed on the passivation layer; and
    a protrusion disposed on the passivation layer and protruding from the upper surface of the passivation layer towards a direction of light emitted from the organic light emitting diode, and an anode disposed on the protrusion,
    wherein the organic light emitting diode has the anode connected to the first conductor part and the anode protrudes from an upper surface of the passivation layer towards a direction of light emitted from the organic light emitting diode.

2. The organic light emitting display panel of claim 1, further comprising a bank covering an outer portion of the anode and defining a plurality of pixels.

3. The organic light emitting display panel of claim 1, wherein the protrusion is formed of an organic layer having black color.

4. The organic light emitting display panel of claim 1, wherein the driving transistor is disposed under the anode.

5. The organic light emitting display panel of claim 1, further comprising a first metal covered by the second insulation layer and covering the driving transistor.

6. The organic light emitting display panel of claim 1, further comprising a second metal covered by the passivation layer and covering the driving transistor.

7. An organic light emitting display panel comprising:
    a substrate;
    a driving transistor disposed on the substrate;
    a first insulation layer covering the driving transistor;
    a second insulation layer covering the first insulation layer and a first metal;
    a first electrode disposed on the second insulation layer and electrically connected to a first conductor part of the driving transistor;
    a second electrode disposed on the second insulation layer and electrically connected to a gate of the driving transistor;
    a passivation layer covering the first electrode, the second electrode, and the second insulation layer;
    an organic light emitting diode disposed on the passivation layer; and
    at least one of a first metal on the first insulation layer and a second metal on the second insulation layer, and the at least one of the first and second metals covering the driving transistor.

8. The organic light emitting display panel of claim 7, further comprising a passivation layer on the second insulation layer.

9. The organic light emitting display panel of claim 8, further comprising an anode disposed on the passivation layer.

10. The organic light emitting display panel of claim 9, further comprising a bank covering an outer portion of the anode and defining a plurality of pixels.

11. The organic light emitting display panel of claim 7, wherein the organic light emitting diode has an anode electrically connected to the first conductor part.

12. The organic light emitting display panel of claim 7, wherein the driving transistor is disposed under the anode.

13. An organic light emitting display device comprising:
    a substrate;
    a driving transistor disposed on the substrate;
    a first insulation layer covering the driving transistor;
    a second insulation layer covering the first insulation layer;
    a first electrode disposed on the second insulation layer and connected to a first conductor part of the driving transistor;
    a second electrode disposed on the second insulation layer and connected to a gate of the driving transistor;
    a passivation layer covering the first electrode, the second electrode, and the second insulation layer;
    an organic light emitting diode disposed on the passivation layer;
    a protrusion disposed on the passivation layer and protruding from the upper surface of the passivation layer towards a direction of light emitted from the organic light emitting diode, and the anode disposed on the protrusion,
    a gate driver supplying a gate pulse to a plurality of gate lines disposed at the substrate;
    a data driver supplying data voltages to a plurality of data lines disposed at the substrate; and
    a controller controlling the gate driver and the data driver,
    wherein the organic light emitting diode has an anode connected to the first conductor part and the anode protrudes from an upper surface of the passivation layer towards a direction of light emitted from the organic light emitting diode.

14. The organic light emitting display panel of claim 13, further comprising a bank covering an outer portion of the anode and defining a plurality of pixels.

15. The organic light emitting display panel of claim 13, wherein the protrusion is formed of an organic layer having black color.

16. The organic light emitting display panel of claim 13, wherein the driving transistor is disposed under the anode.

17. An organic light emitting display device comprising:
a substrate;
a driving transistor disposed on the substrate;
a first insulation layer covering the driving transistor;
a second insulation layer covering the first insulation layer and a first metal;
a first electrode disposed on the second insulation layer and electrically connected to a first conductor part of the driving transistor;
a second electrode disposed on the second insulation layer and electrically connected to a gate of the driving transistor;
a passivation layer covering the first electrode, the second electrode, and the second insulation layer;
an organic light emitting diode disposed on the passivation layer;
at least one of the first metal on the first insulation layer and a second metal on the second insulation layer to cover the driving transistor;
a gate driver supplying a gate pulse to a plurality of gate lines included in the organic light emitting display panel;
a data driver supplying data voltages to a plurality of data lines included in the organic light emitting display panel; and
a controller controlling the gate driver and the data driver.

18. The organic light emitting display panel of claim 17, further comprising a passivation layer on the second insulation layer.

19. The organic light emitting display panel of claim 18, wherein the organic light emitting diode has an anode disposed on the passivation layer.

20. The organic light emitting display panel of claim 19, wherein the driving transistor is disposed under the anode.

21. The organic light emitting display panel of claim 18, wherein the anode is electrically connected to the first conductor part.

22. The organic light emitting display panel of claim 21, further comprising a bank covering an outer portion of the anode and defining a plurality of pixels.

* * * * *